(12) United States Patent
Hung

(10) Patent No.: US 6,897,665 B2
(45) Date of Patent: May 24, 2005

(54) IN-SITU ELECTRON BEAM INDUCED CURRENT DETECTION

(75) Inventor: Hui-Chuan Hung, Taichung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/656,754

(22) Filed: Sep. 6, 2003

(65) Prior Publication Data

US 2005/0052192 A1 Mar. 10, 2005

(51) Int. Cl.[7] ............... G01R 31/302; G01R 31/305; G01N 23/00
(52) U.S. Cl. ............... 324/751; 324/750; 324/158.1; 356/365; 250/310; 250/311
(58) Field of Search .................. 324/501, 750–765; 356/365, 367, 369; 250/310, 311

(56) References Cited

U.S. PATENT DOCUMENTS

| | | | | |
|---|---|---|---|---|
| 4,980,639 A | * | 12/1990 | Yoshizawa et al. | ......... 324/751 |
| 5,523,694 A | * | 6/1996 | Cole, Jr. | ..................... 324/751 |
| 5,952,837 A | * | 9/1999 | Koyama | ..................... 324/752 |
| 6,583,634 B1 | * | 6/2003 | Nozoe et al. | ............... 324/751 |
| 2002/0070738 A1 | * | 6/2002 | Yamada et al. | ............ 324/751 |

* cited by examiner

Primary Examiner—David Zarneke
Assistant Examiner—Emily Y Chan
(74) Attorney, Agent, or Firm—Tung & Associates

(57) ABSTRACT

A method and in-situ sample current amplification system for carrying out failure analysis of integrated circuit semiconductor device conductive portions. The method includes providing an integrated circuit (IC) semiconductor device; providing a pre-amplifier board (PAB) comprising current signal amplification electronics; mounting the IC semiconductor device in electrical communication with the PAB; mounting the PAB comprising the IC semiconductor device in a scanning electron microscope (SEM) for probing the IC semiconductor device with a primary electron beam; exposing at least a portion of the IC semiconductor device to the primary electron beam to induce a current signal within the conductive portions; amplifying the current signal; and, outputting the amplified current signal to an image display system to produce an image representative of an electrical resistance of the conductive portions.

31 Claims, 2 Drawing Sheets

IN-SITU ELECTRON BEAM INDUCED CURRENT DETECTION

FIELD OF THE INVENTION

This invention generally relates to metrology techniques in micro-integrated circuit manufacturing and more particularly to an improved metrology method and sampling system for determining the integrity of micro-integrated circuitry in semiconductor devices by electron beam induced current detection and mapping.

BACKGROUND OF THE INVENTION

Since the introduction of semiconductor devices, the size of semiconductor devices has been continuously shrinking, resulting in smaller semiconductor chip size and increased device density. One of the difficult factors in the continuing evolution toward smaller device size and higher density has been the ability to consistently form small critical dimensions within predetermined error windows. For example, semiconductor feature sizes are frequently subjected to optical or electrical metrology inspections following photolithographic patterning and etching to ensure that critical dimensions are within acceptable limits. In addition, the reliability and continuity of integrated circuitry, for example formed by damascene manufacturing methods, is checked by electrical resistance methods following a manufacturing step. Generally, the electrical integrity of micro-integrated circuitry has been determined by resistance or current testing where automated voltage or current test probes are applied to selected portions of the semiconductor device to sequentially check portions of the circuitry for electrical continuity of the circuitry wiring also referred to as electrical interconnects.

One technique that has been gaining popularity is the use of the scanning electron microscope (SEM) to monitor the current induced by impacting the primary electron beam onto semiconductor features. For example, in a conventional SEM imaging technique a beam of electrons is focused and accelerated onto a small portion of the sample where the impacting electrons create secondary electrons within the sample, of which a portion escape and are emitted into a sub-atmospheric specimen chamber where they are collected into an electron detector to produce a current or voltage which is then processed for imaging the sample. The SEM is superior to optical techniques in that the resolution is orders of magnitude higher, for example in the range of hundreds of Angstroms or less.

In a typical SEM system, a focused electron beam is scanned from point to point on a specimen surface in a rectangular raster pattern. Several variables including accelerating electron beam voltage, electron beam current, and electron beam spot size may be optimized depending on the sample material and the desired magnification.

A typical SEM accelerates and magnetically focuses a beam of electrons having energies typically in the kilovolt range for producing an image from secondary electrons. The brightness or darkness of the processed image depends on the relative amount of detected secondary electrons emitted from the sample which in turn partially depends on the accelerating voltage and the work function of the sample material as well as the topography of the sample. The work function of the sample material additionally defines the electron current that is induced within the sample from impacting primary beam electrons.

In the context of circuit continuity analysis, the SEM has been used to induce voltage, current, or capacitive changes in IC samples by the focused electron beam and measure the magnitude of the voltage changes. Among some of the electron beam methods that have been used for IC failure analysis include capacitive coupling voltage contrast (CCVC), electron beam induced current (EBIC), biased resistive contrast imaging (BRCI), and charge-induced voltage alteration (CIVA).

The CCVC method uses a changing voltage applied to a buried electrical conductor in the IC to produce a change in the secondary electron emission of an incident low-energy electron beam on the device surface of the IC. The EBIC method has been used to identify defects in the device layer of an IC by generating an electron-hole current in semiconductor junctions in the IC. A disadvantage of the EBIC methods of the prior art is that for ICs having overlying layers, the primary electron beam must have sufficient energy to penetrate through the passivation layer to reach the semiconductor device layer in the IC to create a detectable current on the order of about 1 micro-amp. In the BRCI method the sample image is generated by monitoring small fluctuations in the power supply current of an IC as an electron beam is scanned over the IC device surface. In the CIVA method the sample image is generated by monitoring the voltage shifts in a constant-current power supply as a relatively high-energy electron beam (about 5,000 eV or more for a passivated IC) is scanned over a biased IC.

One problem with prior art methods including measuring electron beam induced currents is that a relatively long signal carrying lead is required to transport the signal from the sample to ex-situ measuring devices. For example the sensitivity is generally limited by a signal to noise ratio which effectively limits the detected current sensitivity to about 1 micro-amp. The limited sensitivity of prior art methods creates the need for high energy electron beams to create sufficient current signals which can cause dielectric breakdown and associated electron beam induced damage to the sample, for example by in-situ X-ray generation. In addition, as electron accelerating voltages increase, the signal to noise ratio decreases. Further, as IC metal interconnects become smaller, the interconnect resistance increases, reducing the measurable electron beam induced current for a given electron accelerating voltage.

There is therefore a need in the semiconductor manufacturing art to develop an improved method and apparatus for sampling electron beam induced currents in IC semiconductor devices to increase sample current detection sensitivity to provide more reliable and sensitive measurements for conducting integrated circuitry failure analysis.

It is therefore an object of the invention to provide an improved method and apparatus for sampling electron beam induced currents in IC semiconductor devices to increase sample current detection sensitivity to provide more reliable and sensitive measurements for conducting integrated circuitry failure analysis while overcoming-other shortcomings of the prior art.

SUMMARY OF THE INVENTION

To achieve the foregoing and other objects, and in accordance with the purposes of the present invention, as embodied and broadly described herein, the present invention provides a method and SEM in-situ sample current amplification system for carrying out failure analysis of integrated circuit semiconductor device conductive portions.

In a first embodiment, the method includes providing an integrated circuit (IC) semiconductor device; providing a pre-amplifier board (PAB) comprising current signal amplification electronics; mounting the IC semiconductor device in electrical communication with the PAB; mounting the PAB comprising the IC semiconductor device in a scanning electron microscope (SEM) for probing the IC semiconductor device with a primary electron beam; exposing at least a portion of the IC semiconductor device to the primary electron beam to induce a current signal within the conductive portions; amplifying the current signal; and, outputting the amplified current signal to an image display system to produce an image representative of an electrical resistance of the conductive portions.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method and apparatus of the present invention is explained with respect to, and particularly advantageous for, performing in-situ sample current detection (SCD) and amplification of electron beam induced current (EBIC) and subsequent resistance (current) mapping of the sampled current for failure analysis of semiconductor device integrated circuitry (IC), it will be appreciated that the method of the present invention may additionally be used to produce a signal processed independently and/or in conjunction with the secondary electron signal to produce a convolution of the SCD signal and secondary electron signals for displaying an image. While the method of the present invention is particularly useful for imaging exposed IC conductive features including interconnects using relatively low primary electron beam accelerating Voltages, it will be appreciated that the method may be used for imaging IC subsurface IC conductive interconnects, for example in a lower metallization layer or IC conductive feature having overlying passivation layers.

The electron beam induced current (EBIC) according to an aspect of the present invention is amplified in-situ according to an SEM in-situ sample amplification system to reduce a signal to noise ratio thereby increasing a sample current detection (SCD) sensitivity. The amplified SCD signal is then provided as an input to the imaging display portion of the SEM, for example including a conventional signal processing unit for processing the signal prior to transfer to a display unit to produce a brightness contrast image representative of an electrical resistance in conductive portions of the IC to aid in electrical failure analysis of conductive portions, e.g., conductive interconnect wiring of the IC sample.

Figure 1:
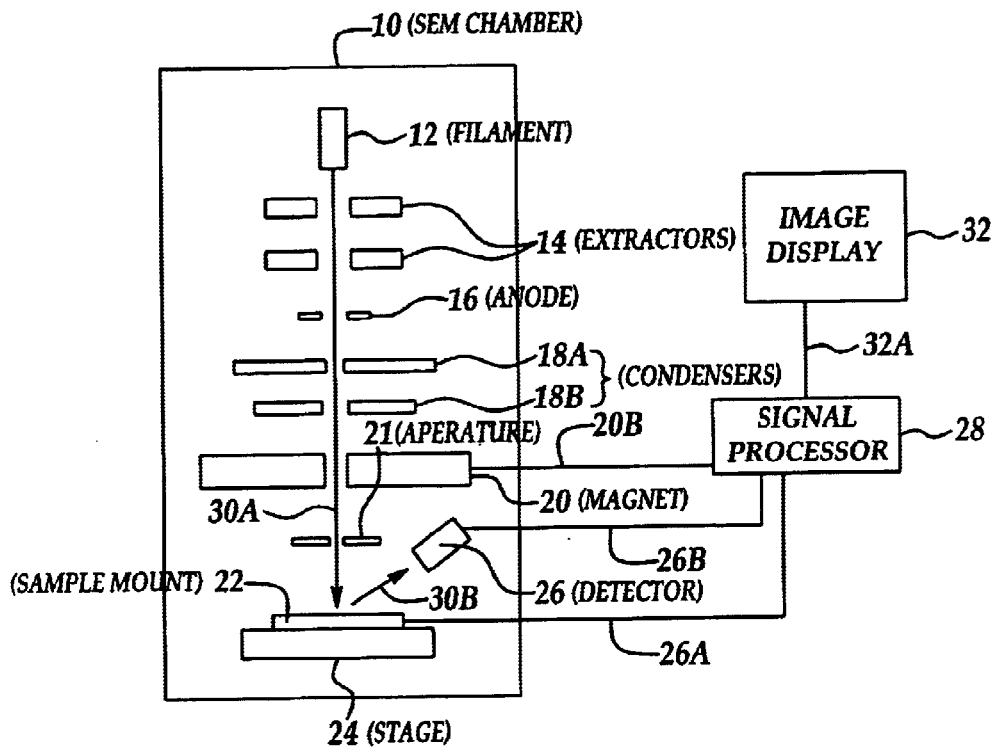
FIG. 1 is a schematic cross sectional representation of elements of a scanning electron microscope for using with the method and apparatus of the present invention.

For example, in an exemplary embodiment, referring to FIG. 1, is a schematic cross sectional representation of a conventional scanning electron microscope (SEM) for use with the method and SEM in-situ sample amplification system of the present invention whereby an electron current is induced by an impacting primary electron beam of the SEM onto an IC sample, for example including IC conductive interconnects (wiring). The SEM includes a vacuum chamber 10 surrounding the SEM components including filament 12 for emitting electrons and an electron extractor e.g., 14 where the electron beam is shaped while being accelerated through anode 16. Condenser lenses, e.g., 18A and 18B further shape the beam profile prior to passing through magnets 20 and aperture 21 for moving the beam in an X and Y direction to scan the electron beam over a selected portion of the sample (not shown) mounted on sample mount 22 disposed on X-Y-Z moveable stage 24.

According to an aspect of the present invention, the sample mount 22 includes an in-situ sample amplification system preferably including a printed circuit board (PCB) including current signal amplification circuitry, for example, a pre-amplifier board (PAB), and where the IC sample (e.g., IC semiconductor chip) is mounted in signal communication with the current signal amplification circuitry, preferably including a CMOS differential amplifier. The X-Y-Z stage 24 may be moved in X and Y horizontal directions as well as vertically including tilting at an angle for positioning the sample mount 22 for impacting the IC sample with the primary electron beam to produce an imaging signal. The PCB further includes a conventional signal output connector for outputting a gain signal to an input side of the image display system, for example along signal line 26A to conventional signal processor 28 and then to image display unit 32 along signal line 32A.

An electron detector 26 is positioned at a predetermined angle above and to one side of the sample mount 22 to capture secondary electrons) backscattered and emitted from the sample surface following primary electron beam impact and secondary electron emission as schematically indicated by directional arrows 30A and 30B, respectively. The electron detector 26 is in signal communication e.g., electrical signal line 26B with a display system, for example including a conventional signal processor 28 for processing an input signal for display on image display unit 32 to form a brightness contrast image.

The image display unit 32 displays an image of a portion of the sample depending on the input to the signal processor 28 and the output to the image display unit 32, for example either secondary electron current signals or in-situ amplified EBIC signals which have been detected and processed to produce a signal. The input signal to the signal processor, for example a current signal from signal lines 26A and/or 26B is processed by signal processor 28 with the aid of information supplied from the scanning magnets 20 e.g., along signal communication line 20B, to produce a displayed image corresponding to an area scanned by the primary electron beam. The X-Y-Z stage 24 including sample mount 22 together with the primary electron beam and beam forming components are housed in a high vacuum environment, for example chamber 10 operating at about $10^{-6}$ Torr. As will be recognized by one skilled in the art of scanning electron microscopy, there are a wide variety of additional metrology tools that may be added to the imaging functions of the SEM including for example, X-ray compositional analysis and focused ion beam milling.

Preferably the SEM used in the method of the present invention is supplied with conventional manual and automated controls for adjusting the various beam parameters. More preferably, the SEM is provided with a computer controlled graphical user interface including displays of the various beam parameters including primary electron beam accelerating voltage which may be manually or automatically set. Preferably, the SEM is equipped with a signal processing system including conventional functions for digitizing, storing and retrieving signal data including processed images and SEM operating parameters.

Figure 2A:
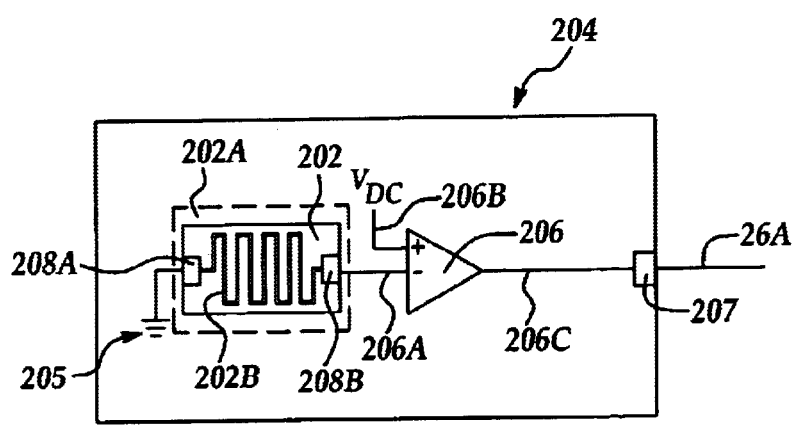
FIG. 2A is a conceptual representation of an IC sample mounted on a circuit board including amplification electronics for sampling EBIC according to an embodiment of the invention.

Referring to FIG. 2A, in an exemplary embodiment, according to an aspect of the present invention, an IC sample 202 is mounted on a printed circuit board assembly (PCB) 204 including conventional amplification electronics (circuit), for example including at least one CMOS differential amplifier e.g., 206. For example, the PCB is preferably a conventional pre-amplifier board (PAB) having an area 202A for mounting an IC sample 202, for example an IC chip including conductive interconnect wiring e.g., 202B, and bonding pads e.g., 208A and 208B to electrically connect the IC sample 202 to a signal input side 206A of the amplifier circuit and to PAB ground potential 205. For example, the sample mounting area 202A is about 1 mm by 1 mm to about 2 mm by about 2 mm. The PAB 204 amplification circuit is schematically represented by showing differential amplifier 206 biased by a DC Voltage source ($V_{DC}$) on Voltage input side 206B, for example from about minus 20 Volts to about plus 20 Volts, more preferably from about minus 18 Volts to about plus 18 Volts A signal output side 206C is signally connected to an output terminal or connector 207 of the PAB board which is connected to a signal line e.g., 26A going to an input side of the image display system.

It will be appreciated that conventional digital signal processing functions and voltage regulation functions may be included on the PAB. For example, the differential amplifier 206 may be connected to conventional selectable feed back resistors to provide a desired signal bandwidth, for example, preferably greater than about 400 KHz. In addition, the differential amplifier may be conventional CMOS low-noise operational amplifiers, for example single or multiple stage dual or quad operational amplifiers, for example including series connected NMOS and PMOS transistors. Preferably, the PAB has a signal amplification capability for sampling and producing amplified current signals having a signal bandwidth greater than about 400 kHz. Preferably, the PAB electronics are capable of amplifying a current signal, for example an electron beam induced current signal from the IC conductive interconnects, by a factor of at least about $10^6$, more preferably, from about $10^6$ to about $10^{12}$ to produce pico-amp SCD sensitivity.

The signal processor 28 preferably processes the GCI input signal for display independently of, and/or in conjunction with another stored or real-time signal (image), for example a previous GCI taken at a different electron beam accelerating Voltage or the secondary electron input signal from electron detector 26. The signal processor 28 is preferably suitable for convoluting separate input signals and/or stored signals for example by adding, subtracting, dividing, or multiplying the separate input signals and/or stored images (signals).

In an exemplary embodiment, an IC sample e.g., sample 202 includes at least an uppermost metallization layer having conductive interconnect wiring, for example copper, aluminum, or tungsten, preferably copper, and having linewidths from about 0.1 microns to about 0.25 microns and at least two conventional exposed bonding pads, for example copper with an overlying thin layer of aluminum alloy for wire bonding an input signal line and an output signal line. The IC sample may be a multi-layer semiconductor device including multiple metallization layers and inter-layer dielectric layers. The conductive interconnects are preferably formed by a conventional damascene process having a thickness of from about 3000 Angstroms to about 8000 Angstroms. It will be appreciated that the conductive interconnect wiring may include an at least one overlying passivation layer of dielectric and/or organic insulating material to protect the conductive interconnects from damage and oxidation, for example silicon oxide, silicon nitride and/or polyimide having a total thickness of preferably less than about 5000 Angstroms, more preferably less than about 1000 Angstroms. More preferably, the conductive interconnect wiring is exposed to allow relatively lower electron beam accelerating voltages to reduce electron beam induced damage and allow for the imaging of underlying metallization layers at electron beam accelerating Voltages of less than about 3000 eV, more preferably less than about 1000 eV.

In operation, the IC sample 202 is mounted onto a sample area 202A on the PAB 204 with a conventional adhesive, for example electrically insulating glue, and is wired from respective bonding pads 208A and 208B. The PAB is then loaded into the SEM onto the X-Y-Z stage, preferably in electrical isolation from the X-Y-Z stage (SEM ground potential) and the PAB signal output side is electrically connected to the input side of the signal (image) processing unit 28 e.g., via signal line 26B for imaging the sample 202. For example, conventional processes for bringing the electron gun up to an operating filament current, adjusting the electron beam characteristics by adjusting a beam accelerating voltage as well as focusing the electron beam by adjusting the lens (condenser) current and lens voltage are carried out to prepare the SEM for a conventional imaging process. For example, the electron beam accelerating voltage is adjusted from about 100 eV to about 10000 eV, more preferably less than about 3000 eV depending on whether the metal interconnects are covered by a passivation layer, whether lower level metallization layers are desired to be imaged, and whether the image will be convoluted with the secondary electron image. It will be appreciated that the various SEM operating parameters, for example, lens voltage and current, filament current, and beam current will vary depending on numerous parameters including the sample material, sample position, vacuum conditions, the sample material, as well as the age of the filament and the cleanliness of the beam forming parts.

Figure 2B:
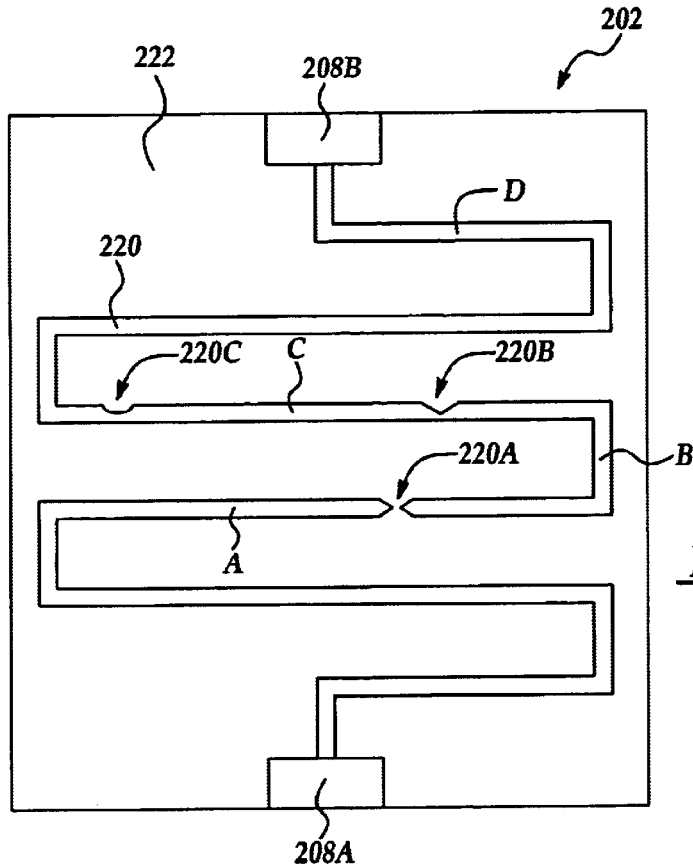
FIG. 2B is an expanded conceptual representation of an IC sample and imaged by RCI according to an embodiment of the invention.

Referring to FIG. 2B is shown an exemplary expanded top planar representation of the sample 202, for example an IC chip. An exemplary conductive interconnect pathway 220, for example a copper filled interconnect formed in an uppermost dielectric insulating layer 222 is shown in electrical communication with bonding pad 208A leading to ground potential and output bonding pad terminal 208B leading to pre-amplifier electronics on the PAB. A complete break (open) in the continuity of interconnect pathway 220, e.g., 220A is shown together with a relatively larger constricted portion 220B and a relatively smaller constricted portion 220C. For example the open portion 220A and constricted portions 220B and 220C of the interconnect pathway 220 are defects caused by various processing conditions. In exemplary operation, upon electron beam impact, current induced in the interconnect pathway 220 is fed to the input side of the imaging electronics of the SEM, for example to signal processor 28 and then to image display unit 32 as shown in FIG. 1. For example, the portion of the image generated by the EBIC in portion A of the interconnect pathway 220 prior to (upstream of) open portion 220A will appear dark in the SCD mapped (image processed) SEM image. Portion B, upstream of constricted portion 220B, which creates a relatively lower electrical resistance to EBIC flow compared to an open, will appear as a dark shade of grey, lighter than portion A. Portion C between constricted portions 220B and 220C, will appear as a lighter shade of grey consistent with the lower resistance to current flow represented by constricted portions 220C. For example, non-defective portions of the interconnect pathway 220, e.g., portion D, will appear as the brightest portion of the image due to an unconstricted resistance to EBIC current flow. It will be appreciated that the various contrasts may be adjusted by electron beam operation parameters. As a result, the resistance of conductive interconnect wiring in an IC chip may be effectively visually mapped to produce a resistive contrast image (RCI), allowing defective portions of the IC wiring to be located in-situ. Once located, the defective area may be imaged separately by conventional secondary electrons or may be convoluted with the SCD and/or RCI image to better locate and assess the extent of failure.

Figure 3:
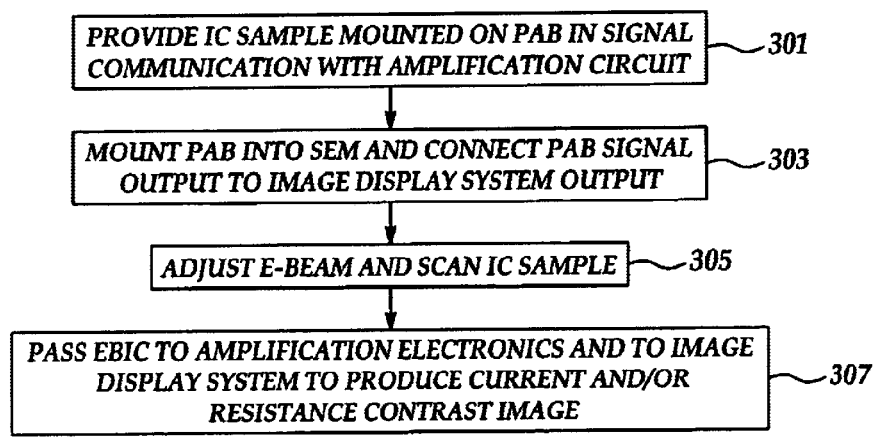
FIG. 3 is a process flow diagram including several embodiments of the present invention.

Referring to FIG. 3 is a process flow diagram including several embodiments of the present invention. In process 301, an IC sample is mounted on a PAB including an amplification circuit according to preferred embodiments. In process 303, the PAB including the IC sample is mounted into an SEM a signal output from the PAB is connected to the input side of an image display unit. In process 305, an electron beam operating parameters including an accelerating Voltage is adjusted according to preferred embodiments and the IC sample scanned with the electron beam. In process 307, an electron beam induced current (EBIC) in the IC sample is amplified and passed to the image display unit to produce a brightness contrast image, for example a scanned current detection (SCD) contrast image and/or a resistive contrast image (RCI).

Thus, a method and in-situ sample amplification system has been presented for producing electron beam induced current brightness contrast images having an improved brightness contrast at relatively lower electron beam accelerating Voltages. It has been found that by mounting the IC sample in close proximity to the amplification circuitry, for example within about 1 mm to about 5 cm of the sample during electron beam scanning, that the signal to noise ratio of amplified sample current can be dramatically improved to achieve sensitivities on the order of 1 pico-amp using conventional PAB electronics including CMOS differential amplifiers. As a result, the imaging sensitivity is improved allowing improved in-situ location of resistive defects, including imaging conductive interconnects covered by one or more passivation layers and imaging underlying metallization levels at relatively low electron beam Voltages. An added advantage is that the amplified current signal may be convoluted with the secondary electron signals to produce a composite image which may be used to more effectively locate and further examine detective conductive portions of the IC sample. IC semiconductor device metrology and quality control is thereby improved leading to improved processes and improved semiconductor device reliability.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for carrying out failure analysis of integrated circuit semiconductor device conductive portions comprising the steps of:
   providing an integrated circuit (IC) semiconductor device comprising at least one conductive interconnect portion;
   providing a printed circuit board (PCB) comprising a current signal amplification circuit having a current signal input side and a current signal output side for outputting an amplified current signal;
   mounting the IC semiconductor device such that the at least one conductive interconnect portion is electrically connected between a ground potential of the PCB and the current signal input side;
   mounting the PCB comprising the IC semiconductor device in a scanning electron microscope (SEM) for impacting a surface of the IC semiconductor device with a primary electron beam;
   exposing at least a portion of the IC semiconductor device to the primary electron beam to induce a current signal within the conductive portions;
   passing the induced current signal through the amplification electronics to amplify the current signal; and,
   outputting the amplified induced current signal from the current signal output side to an image display system input side to produce an image comprising a brightness contrast.

2. The method of claim 1, wherein the PCB comprises a pre-amplifier board (PAB) including a current signal amplification circuit having at least one CMOS differential amplifier.

3. The method of claim 2, wherein the at least one CMOS differential amplifier comprises a low-noise operational amplifier.

4. The method of claim 1, wherein the current signal is amplified by at least about a factor of $10^6$.

5. The method of claim 1, wherein the current signal is sampled at a bandwidth of greater than about 400 kHz.

6. The method of claim 2, wherein the at least one CMOS differential amplifier is DC biased at from about minus 20 Volts to about plus 20 Volts.

7. The method of claim 1, wherein the primary electron beam is adjusted to have an accelerating voltage from about 100 eV to about 10000 eV.

8. The method of claim 1, wherein the primary electron beam is adjusted to have an accelerating voltage of less than about 3000 eV.

9. The method of claim 1, wherein the IC semiconductor device comprises multi-level metallization layers.

10. The method of claim 9, wherein the surface of the IC semiconductor device comprises an exposed surface of the at least one conductive interconnect.

11. The method of claim 10, wherein the surface of the IC semiconductor device comprises at least one passivation layer overlying the at least one conductive interconnect.

12. The method of claim 1, wherein a second current signal produced by detection of secondary electrons emitted from the IC semiconductor device is convoluted with the current signal to produce a composite image.

13. A method for carrying out failure analysis of integrated circuit semiconductor device conductive portions comprising the steps of:
   providing an integrated circuit (IC) semiconductor device comprising conductive portions;
   providing a pre-amplifier board (PAB) comprising current signal amplification electronics having a current signal input side and a current signal output side for outputting an amplified current signal;

mounting the IC semiconductor device in electrical communication with ground potential of the PAB and the current signal input side;

mounting the PAB comprising the IC semiconductor device on a moveable stage in a scanning electron microscope (SEM) for probing the IC semiconductor device with a primary electron beam;

exposing at least a portion of the IC semiconductor device to the primary electron beam to induce a current signal within the conductive portions;

amplifying the current signal by a factor of about $10^6$ at a bandwidth of greater than about 400 kHz; and, outputting the amplified current signal to an image display system to produce an image representative of an electrical resistance of the conductive portions.

14. The method of claim 13, wherein the PAB comprises at least one CMOS differential amplifier.

15. The method of claim 14, wherein the at least one CMOS differential amplifier is DC biased at from about minus 20 Volts to about plus 20 Volts.

16. The method of claim 13, wherein the primary electron beam is adjusted to have an accelerating voltage of less than about 3000 eV.

17. The method of claim 13, wherein the IC semiconductor device comprises multi-level metallization layers.

18. The method of claim 17, wherein the surface of the IC semiconductor device comprises an exposed surface of the at least one conductive interconnect.

19. The method of claim 17, wherein the surface of the IC semiconductor device comprises at least one passivation layer overlying the at least one conductive interconnect.

20. The method of claim 13, wherein a second current signal produced by detection of secondary electrons emitted from the IC semiconductor device is convoluted with the current signal to produce a composite image.

21. An SEM in-situ sample amplification system for carrying out in-situ current amplification of electron beam induced current to increase a current detection sensitivity comprising:

a printed circuit board (PCB) comprising a current signal amplification circuit said current signal amplification circuit comprising a current signal input side and a current signal output side for outputting an amplified current signal;

an IC semiconductor device mounted on the PCB adjacent the current signal input side, said IC semiconductor device comprising a conductive interconnect pathway disposed in electrical communication with the PCB ground potential and the current signal input side;

wherein the PCB comprising the IC semiconductor device is mountable in a scanning electron microscope (SEM) for probing the IC semiconductor device with a primary electron beam to produce the amplified current signal for input to an input side of an image display unit.

22. The SEM in-situ sample amplification system of claim 21, wherein the current signal amplification circuit comprises a pre-amplifier board (PAB) including at least one CMOS differential amplifier.

23. The SEM in-situ sample amplification system of claim 22, wherein the at least one CMOS differential amplifier comprises a low-noise amplifier.

24. The SEM in-situ sample amplification system of claim 21, wherein the PCB comprises an electrically insulating polymeric material.

25. The SEM in-situ sample amplification system of claim 21, wherein the current signal amplification circuit is capable of amplifying the current signal by at least about a factor of $10^6$.

26. The SEM in-situ sample amplification system of claim 21, wherein the current signal is detectable to a level of about 1 pico-ampere.

27. The SEM in-situ sample amplification system of claim 21, wherein the current signal amplification circuit operates at a signal bandwidth of greater than about 400 kHz.

28. The SEM in-situ sample amplification system of claim 21, wherein the PCB further comprises a DC power source for biasing the at least one differential amplifier from about minus 20 Volts to about plus 20 Volts.

29. The SEM in-situ sample amplification system of claim 21, wherein the IC semiconductor device comprises multi-level metallization layers comprising conductive interconnects.

30. The SEM in-situ sample amplification system of claim 21, wherein the surface of the IC semiconductor device comprises an exposed surface of the conductive interconnects.

31. The SEM in-situ sample amplification system of claim 21, wherein the surface of the IC semiconductor device comprises at least one passivation layer disposed over the conductive interconnects.

* * * * *